United States Patent
Yeates et al.

(10) Patent No.: US 9,125,331 B2
(45) Date of Patent: Sep. 1, 2015

(54) METHOD FOR ATTACHING A FLEX CIRCUIT TO A PRINTED CIRCUIT BOARD

(75) Inventors: Kyle Yeates, Palo Alto, CA (US); Teodor Dabov, Mountain View, CA (US); Stephen Brian Lynch, Portola Valley, CA (US)

(73) Assignee: APPLE INC., Cupertino, CA (US)

( * ) Notice: Subject to any disclaimer, the term of this patent is extended or adjusted under 35 U.S.C. 154(b) by 516 days.

(21) Appl. No.: 13/598,362

(22) Filed: Aug. 29, 2012

(65) Prior Publication Data
US 2013/0042955 A1 Feb. 21, 2013

Related U.S. Application Data

(63) Continuation of application No. 12/234,479, filed on Sep. 19, 2008, now Pat. No. 8,263,872.

(60) Provisional application No. 61/030,493, filed on Feb. 21, 2008.

(51) Int. Cl.
*H05K 3/30* (2006.01)
*H05K 3/32* (2006.01)
*H05K 3/36* (2006.01)

(52) U.S. Cl.
CPC .............. *H05K 3/323* (2013.01); *H05K 3/361* (2013.01); *H05K 2201/10371* (2013.01); *H05K 2203/0278* (2013.01); *Y10T 29/49126* (2015.01); *Y10T 156/10* (2015.01)

(58) Field of Classification Search
CPC .... H05K 9/0022; H05K 9/0024; H05K 9/003
See application file for complete search history.

(56) References Cited

U.S. PATENT DOCUMENTS

| | | |
|---|---|---|
| 3,065,446 A | 11/1962 | Langzettel et al. |
| 3,154,365 A | 10/1964 | Crimmins |
| 6,053,746 A | 4/2000 | Yoshizawa |
| 6,090,728 A * | 7/2000 | Yenni et al. ............. 442/117 |
| 6,249,487 B1 * | 6/2001 | Yano et al. ............. 368/47 |
| 6,483,719 B1 * | 11/2002 | Bachman .............. 361/816 |
| 6,514,089 B2 | 2/2003 | Satou |
| 7,544,066 B1 | 6/2009 | Lynch et al. |
| 2003/0019568 A1 | 1/2003 | Liu et al. |
| 2007/0051251 A1 | 3/2007 | Kim et al. |
| 2009/0067147 A1 | 3/2009 | Suzuki |
| 2010/0251541 A1 | 10/2010 | Saito |

FOREIGN PATENT DOCUMENTS

JP 2003298285 A * 10/2003

* cited by examiner

*Primary Examiner* — Carl Arbes
(74) *Attorney, Agent, or Firm* — Downey Brand LLP

(57) ABSTRACT

Methods and systems for bonding a flex circuit to a printed circuit board (PCB) using an anisotropic conductive film (ACF) bonding process are disclosed. According to one aspect of the present invention, supports may be attached to an electromagnetic interference (EMI) shielding can in such a way that the EMI shielding can is arranged to support and/or spread forces involved in ACF bonding. The supports may be located proximate to the walls of the EMI shielding can, and positioned such that the supports effectively do not come into contact with components mounted on a PCB along with the EMI shielding can.

12 Claims, 4 Drawing Sheets

METHOD FOR ATTACHING A FLEX CIRCUIT TO A PRINTED CIRCUIT BOARD

CROSS-REFERENCE TO RELATED APPLICATIONS

This application is a Continuation application and claims priority to U.S. patent application Ser. No. 12/234,479, filed Sep. 19, 2008, now U.S. Pat. No. 8,263,872, entitled "SMALL FORM FACTOR DESK TOP COMPUTER," by Yeates et al. U.S. patent application Ser. No. 12/234,479 claims priority 35 U.S.C. 119(e) to U.S. Provisional Patent Application No. 61/030,493, filed Feb. 21, 2008, entitled "METHOD AND APPARATUS FOR ATTACHING A FLEX CIRCUIT TO A PRINTED CIRCUIT BOARD", which is incorporated by reference in their entirety for all purposes.

BACKGROUND OF THE INVENTION

1. Field of the Invention

The present invention relates to the formation of circuit board assemblies and, more particularly, to the bonding of a flex circuit to a printed circuit board.

2. Description of the Related Art

Anisotropic conductive film (ACF) bonding is a technology that is used to attach flex circuits to printed circuit boards (PCBs). ACF bonding typically includes applying an ACF bond material between a PCB and a flex circuit that is to be bonded to the PCB. Once the ACF bond material is applied between the PCB and the flex circuit, an increased pressure and an increased temperature are applied to the PCB and the flex circuit. That is, the layer stack formed from the PCB, the ACF bond material, and the flex circuit are effectively "sandwiched" and subjected to an increased pressure and an increased temperature.

Often, opposing ACF support heads may be used to apply force and, hence, an increased pressure to the layer stack. One of the opposing ACF support heads may be heated such that an increased temperature may be applied to the layer stack. If the opposing ACF support heads come into contact with components of the PCB, the relatively high forces and pressures applied by the opposing ACF support heads may damage such components and, hence, adversely affect the integrity of and the performance of an overall PCB assembly that includes the PCB. As a result, the area on the PCB onto which the opposing ACF support heads are arranged to apply relatively high forces and pressures are generally devoid of components.

The footprint associated with opposing ACF support heads may be relatively large. That is, an ACF support head may essentially require that a significant amount of real estate on a PCB be substantially devoid of components in order for a flex circuit to be bonded to the PCB without compromising the integrity of and the performance of the PCB. Because real estate on a PCB is typically at a premium, leaving open space on the PCB in order to accommodate an ACF support head may be impractical, if not impossible.

To provide for open space on a PCB in order to accommodate an ACF support head, the size of the PCB may be increased. However, increasing the size of a PCB may be expensive and unworkable. By way of example, if a PCB is intended to fit in a chassis or a housing of a particular size, it may not be possible to increase the physical size of the PCB in order to provide open space. In addition, increasing the size of a PCB goes against the overall trend of tightly spacing components such that a PCB may be sized to be no larger than necessary to accommodate all desired components Therefore, what is needed is a method and an apparatus that allows an ACF bonding process to be used to bond a flex circuit to a PCB without applying an increased pressure and an increased temperature to components of the board. That is, what is desired is a method and an apparatus for using an ACF bonding process to bond a flex circuit to a PCB without compromising the integrity of components on the PCB, and without substantially requiring excess open space on the PCB.

SUMMARY OF THE INVENTION

The present invention pertains to techniques that enable landing points to be formed for "sandwiching heads" on printed circuit boards (PCBs) with limited or substantially no open space. Such techniques enable anisotropic conductive film (ACF) bonding to occur such that a flex circuit may be bonded to a PCB substantially without damaging components mounted to the PCB.

The present invention may be implemented in numerous ways, including, but not limited to, as a method, system, device, or apparatus. Several embodiments of the present invention are discussed below.

According to one aspect of the present invention, supports may be attached to an electromagnetic interference (EMI) shielding can in such a way that the EMI shielding can is arranged to support and/or spread forces involved in ACF bonding. The supports may be in close proximity to the walls of the EMI shielding can, and positioned such that the supports effectively do not come into contact with components mounted on a PCB along with the EMI shielding can.

In accordance with another aspect of the present invention, an EMI shielding can is modified such that the EMI shielding can, itself, may support and/or spread forces involved with ACF bonding. Allowing the EMI shielding can to support and/or spread forces associated with ACF bonding allows for the efficient utilization of space on a PCB, as PCBs are often fit challenged and lack open or otherwise available space.

According to still another aspect of the present invention, an apparatus includes a PCB, a flex circuit, an EMI can, and a shielding support. The EMI shielding can is mounted on the PCB, and the EMI shielding can includes at least one wall. The shielding support is in contact with the PCB and located proximate to the at least one wall. The shielding support supports a load applied by an ACF support head during an ACF process, and transfers the load such that an ACF bond may be formed between the PCB and the flex circuit.

According to yet another aspect of the present invention, an apparatus includes a PCB and a flex circuit. The apparatus also includes an EMI shielding can arrangement that is mounted on the PCB. The EMI shielding can arrangement includes a support structure, the support structure which is arranged to support a load applied by an ACF support head during an ACF process. The support structure is also arranged to transfer the load such that an ACF bond may be formed between the PCB and the flex circuit.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, in which.

DETAILED DESCRIPTION OF THE INVENTION

The invention pertains to techniques that enable landing points to be formed for "sandwiching heads," e.g., sandwiching heads used in an anisotropic conductive film (ACF) bonding process, on printed circuit boards (PCBs) with limited or substantially no open space. Providing landing points proximate to the edge of an electromagnetic interference (EMI) can that is mounted on a PCB allows the landing points to be positioned substantially at locations on the PCB which are typically open. Hence, pressure and/or heat may be applied by sandwiching heads during the ACF bonding process substantially without resulting in the pressure and/or heat being applied to components mounted on a PCB that may be damaged by the pressure and/or heat.

In order to bond a flex circuit to a PCB, an ACF bond is often formed between the flex circuit and the PCB. To form the ACF bond between the flex circuit and the PCB, sandwiching heads may apply pressure and heat to the PCB and to the flex circuit. By locating landing points for the sandwiching heads proximate to the edge of an EMI can, where components are typically not located, space generally does not need to be specifically allocated for the landing points.

Figure 1:
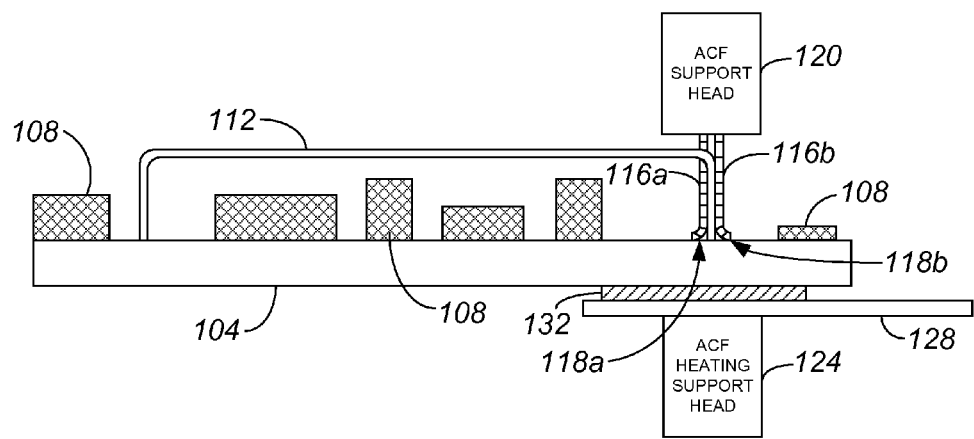
FIG. 1 is a diagrammatic side-view representation of a printed circuit board (PCB) assembly that includes a flex circuit and support members for an anisotropic conductive film (ACF) support head located proximate to the edge of an electromagnetic interference (EMI) shielding can in accordance with an embodiment of the present invention.

Referring initially to FIG. 1, a PCB on which landing points for sandwiching heads are located proximate to the edge of an EMI shielding can will be described in accordance with an embodiment of the present invention. A PCB 104 has components 108, e.g., electrical components, mounted thereon. An EMI shielding can 112, which is arranged over at least some components 108, is configured to prevent disturbances associated with external electromagnetic radiation from affecting those components 108 which are effectively shielded by EMI shielding can 112.

A flex circuit 128 is substantially bonded to PCB 104 through an ACF bond 132. ACF bond 132 is created when pressure and heat are applied to PCB 104 and flex circuit 128 such that an ACF forms ACF bond 132. To form ACF bond 132, pressure and heat may be applied by ACF support heads 120, 124. In one embodiment, ACF support head 120 is arranged to apply pressure to PCB 104 through landing points 118a, 118b on PCB 104, while ACF heating support head 124 is arranged to apply heat to flex circuit 128. It should be appreciated that applying pressure to PCB 104 generally involves applying pressure to flex circuit 128 as well, while applying heat to flex circuit 128 generally involves applying heat to PCB 104. In other words, ACF support heads 120, 124 cooperate to apply pressure and heat to an overall "sandwich" formed by PCB 104, the ACF that forms ACF bond 132, and flex circuit 128.

Landing points 118a, 118b are located proximate to an edge of EMI shielding can 112. A first landing point 118a is located along an inner wall line of EMI shielding can 112, and a second landing point 118b is located at an outer wall line of EMI shielding can 112. ACF support head 120 is supported on shielding supports 116a, 116b such that ACF support head 120 may apply pressure on PCB 104 through landing points 118a, 118b. Shielding supports 116a, 116b may be used to transfer the load from ACF support head 120 to landing points 118a, 118b.

Landing points 118a, 118b may be either continuous or incremental along the overall wall line of EMI shielding can 112. In one embodiment, EMI shielding can 112 may include at least one opening (not shown) through which shielding support 116a may pass. That is, open areas (not shown) may be formed in EMI shielding can 112 such that shielding support 116a may be received.

Figure 2:
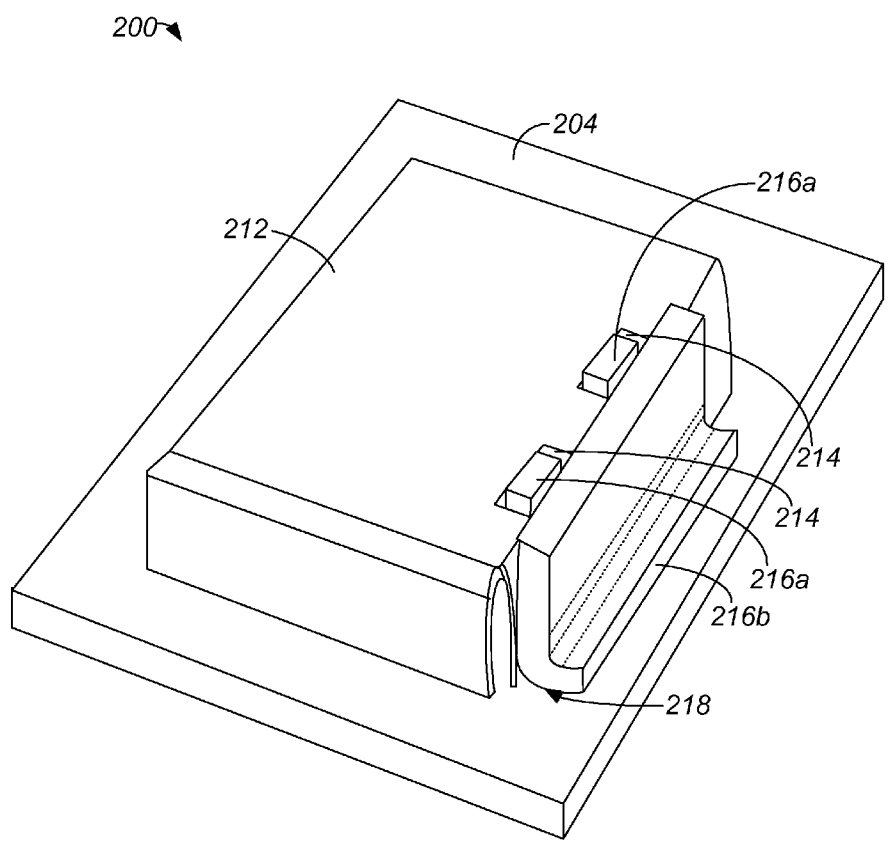
FIG. 2 is a diagrammatic perspective-view representation of a PCB assembly that includes a flex circuit and landing points for an ACF support head that are located proximate to the edge of an EMI shielding can in accordance with an embodiment of the present invention.

FIG. 2 is a diagrammatic perspective-view representation of a PCB assembly that includes a flex circuit and landing points for an ACF support head that are located proximate to the edge of an EMI shielding can in accordance with an embodiment of the present invention. An overall PCB assembly 200 includes a PCB 204 and an EMI shielding can 212. For ease of illustration, electrical traces and components, e.g., electrical circuit components, that may be mounted on PCB 204 are not shown.

Shielding supports 216a, 216b are arranged to transfer a load from an ACF support head (not shown) to landing points. EMI shielding can 212 includes openings 214 that allow shielding supports 216a, or inside shielding supports, to pass through EMI shielding can 212 such that shielding supports 216a may contact an ACF support head (not shown). Landing point 218, as shown, is substantially continuous along a wall line of EMI shielding can 212, and is associated with shielding support 216b. An overall landing point (not shown) which is associated with shielding supports 216a may be substantially incremental.

An EMI shielding can is not limited to including openings when there are shielding supports proximate to an inside wall of the EMI shielding can. By way of example, shielding supports may effectively come into indirect contact with an ACF support head through the EMI shielding can. That is, the wall of an EMI shielding can may also be used to transfer a load from an ACF support head, i.e., the wall may be sandwiched between ACF support heads. If the wall of an EMI shielding can is sandwiched between ACF support heads, the walls may be configured to include additional structural support to support the application of a load. One or more support members may be placed adjacent to the wall of an EMI shielding can to provide structural support. Such support members, which allow the EMI shielding can to support the application of a load, may be continuous along the wall, or they may instead be incrementally located. The support members may also be integral with the EMI shielding can, attached to the EMI shielding can, and/or separate from the EMI shielding can. It should be appreciated that such support members may either be used in addition to, or in lieu of, shielding supports such as shielding supports 116a, 116b of FIG. 1.

Figure 3:
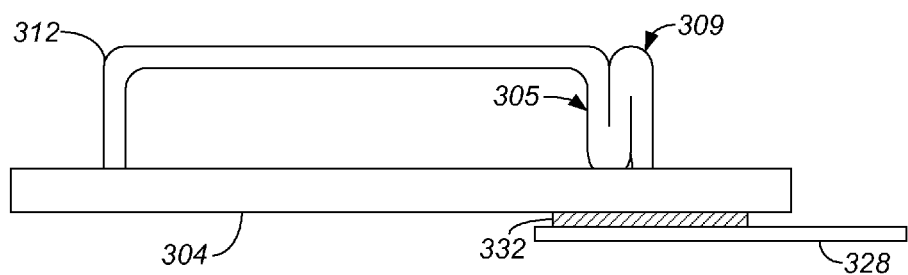
FIG. 3 is a diagrammatic side-view representation of a PCB assembly in which a structural support for an ACF support head is substantially integral to an EMI shielding can in accordance with an embodiment of the present invention.

In one embodiment, support members are a portion of an EMI shielding can. That is, support members that provide structural support for an EMI shielding can are integral to the EMI shielding can, as discussed above. For example, the wall of an EMI shielding can may be formed by effectively folding additional walls next to the primary EMI shielding can wall. FIG. 3 is a diagrammatic side-view representation of a PCB assembly in which a structural support is substantially integral to an EMI shielding can in accordance with an embodiment of the present invention. A PCB 304 is arranged to be bonded with a flex circuit 328 through an ACF bond 332. An EMI shielding can 312 is configured to shield components (not shown) over which EMI shielding can 312 is placed.

A primary EMI shielding can wall 305 is positioned next to a folded wall arrangement 309 that may be created by bending EMI shielding can 312. The overall support structure formed from primary EMI shielding can wall 305 and folded wall arrangement 309 allow EMI shielding can 312 to support a load applied over the overall support structure.

Figure 4:
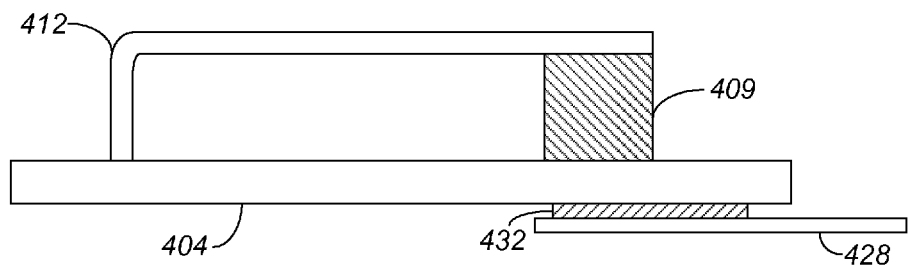
FIG. 4 is a diagrammatic side-view representation of a PCB assembly in which a structural support for an ACF support head effectively serves as a wall of an EMI shielding can in accordance with an embodiment of the present invention.

In another embodiment, a solid structural bar may replace a primary EMI shielding can wall. FIG. 4 is a diagrammatic side-view representation of a PCB assembly in which a support member arranged to support a load effectively serves as a wall of an EMI shielding can in accordance with an embodiment of the present invention. A PCB 404 is arranged to be bonded with a flex circuit 428 through an ACF bond 432. An EMI shielding can 412 is configured to shield components (not shown) over which EMI shielding can 412 is placed. A solid structural bar 408 effectively replaces at least one wall of EMI shielding can 412. Solid structural bar 408, which may be of substantially any shape, supports EMI shielding can 412 during the application of a load, e.g., a force or a pressure, by an ACF support head (not shown). Such a load may be applied during an ACF bonding process. Solid structural bar 408 effectively allow EMI shielding can 412 to retain its integrity during an ACF bonding process. That is, solid structural bar 408 may reduce the amount by which EMI shielding can 412 may deform when a load is applied to a portion of EMI shielding can 412 during an ACF bonding process used to form ACF bond 432 between PCB 404 and flex circuit 428.

Figure 5:
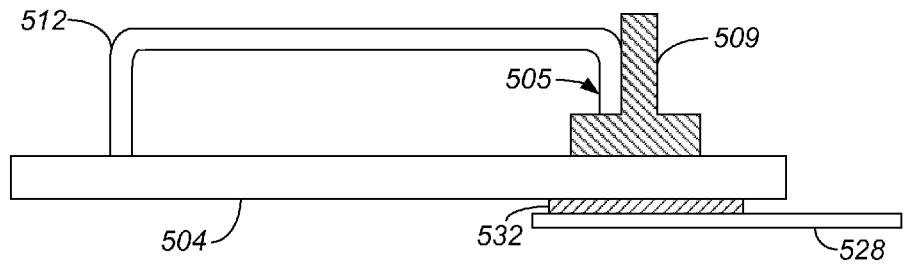
FIG. 5 is a diagrammatic side-view representation of a PCB assembly in which a structural support for an ACF support head is placed at least partially next to a wall of an EMI shielding can in accordance with an embodiment of the present invention.

A structural support member or component may be placed next to the wall of an EMI shielding can. In one embodiment, the structural support member may additionally be positioned at least partially under a wall of the EMI shielding can. FIG. 5 is a diagrammatic side-view representation of a PCB assembly in which a support structure is placed at least partially next to a wall of an EMI shielding can in accordance with an embodiment of the present invention. A PCB 504 is arranged to be bonded with a flex circuit 528 through an ACF bond 532. An EMI shielding can 512 is configured to shield components (not shown) over which EMI shielding can 512 is placed. A support member 509 is positioned in proximity to a wall 505 of EMI shielding can 512. Support member 509 is arranged to shoulder at least some of the load that could otherwise be applied to EMI shielding can 512 during an ACF bonding process.

As shown, wall 505 of EMI shielding can 512 may be at least partially supported on support member 509 while being positioned such that a side of wall 505 of EMI shielding can 512 is in proximity to support member 509. A bottom surface of wall 505 of EMI shielding can 512 may be supported on a first portion of support member 509 while an outer surface of wall 505 may be in contact with a second portion of support member 509.

Figure 6:
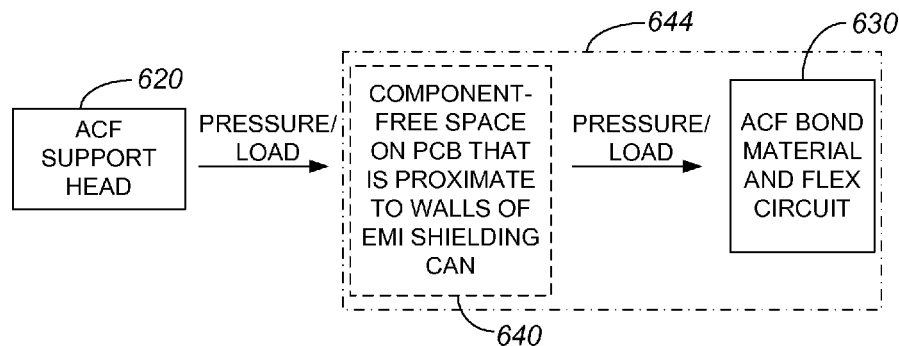
FIG. 6 is a block diagram representation of an ACF support head applying pressure on a layer stack through component-free space on a PCB that is in proximity to walls of an EMI shielding can in accordance with an embodiment of the present invention.

With reference to FIG. 6, a process of applying pressure on a layer stack that includes a PCB, a flex circuit, and an ACF bond formed between the PCB and the flex circuit will be described in accordance with an embodiment of the present invention. FIG. 6 is a block diagram representation of an ACF support head applying pressure on a layer stack through component-free space on a PCB that is in proximity to walls of an EMI shielding can in accordance with an embodiment of the present invention. An ACF support head 620 applies a pressure or a load to an overall layer stack 644 during an ACF bonding process. In the described embodiment, the ACF support head 620 applies a pressure to a component free space on a PCB 640 that is proximate to the walls of an EMI shielding can. That pressure may be substantially transferred from the component free space in the PCB 640 to the ACF from which a bond may be formed and the flex circuit 630.

Although only a few embodiments of the present invention have been described, it should be understood that the present invention may be embodied in many other specific forms without departing from the spirit or the scope of the present invention. By way of example, an EMI shielding can wall may include at least one opening that allows the EMI shielding can to receive an ACF support head.

In general, the size, e.g., the area, associated with landing points may vary widely. The size associated with the landing points may, for example, vary depending upon the amount of available or open space in proximity to the walls of an EMI shielding can. Additionally, the size associated with the landing points may vary depending upon the forces and pressures that are desired for a particular ACF bonding process.

Structural members which are used to provide structural support to an EMI shielding can to enable the EMI shielding can to sustain a direct load applied during an ACF bonding process may be discrete or continuous. That is, structural support may be provided at discrete points or regions along a wall of an EMI shielding can, or may be provided continuously along the wall of an EMI shielding can. It should be appreciated that if the use of structural support involves removing the actual wall of the EMI shielding can, as for example if the solid structural bar of FIG. 4 is used to provide structural support, the structural support may also be provided at discrete regions with respect to an edge of the EMI shielding can or continuously with respect to an edge of the EMI shielding can.

The steps associated with the methods of the present invention may vary widely. Steps may be added, removed, altered, combined, and reordered without departing from the spirit of the scope of the present invention. Therefore, the present examples are to be considered as illustrative and not restrictive, and the invention is not to be limited to the details given herein, but may be modified within the scope of the appended claims.

The invention claimed is:

1. A method for performing conductive pressure sensitive adhesive (PSA) bonding, the method comprising:
   receiving a printed circuit board, the printed circuit board having an electromagnetic interference (EMI) shielding can mounted thereon, the EMI shielding can including at least one wall, wherein the PCB includes at least one support arrangement located proximate to the wall;
   receiving a flex circuit;
   locating a conductive PSA between the PCB and the flex circuit, wherein the PCB, the flex circuit, and the conductive PSA form a layer stack;

applying a load to the at least one support arrangement, wherein applying the load to the at least one support arrangement causes the load to be applied on a first surface of the layer stack; and applying heat to a second surface of the layer stack, wherein the pressure and the heat are applied by a plurality of ACF support heads.

2. The method of claim 1 wherein the EMI shielding can is configured to enable the at least one support arrangement to pass therethrough.

3. The method of claim 2 wherein the at least one support arrangement is located proximate to an inner surface of the wall.

4. The method of claim 1 wherein the first surface of the layer stack is associated with the PCB and the second surface of the layer stack is associated with the flex circuit.

5. The method of claim 1 wherein applying the heat to the second surface of the layer stack causes the ACF to bond to the PCB and to the flex circuit.

6. A method for performing conductive pressure sensitive adhesive (PSA) bonding, the method comprising:

receiving a printed circuit board, the printed circuit board having an electromagnetic interference (EMI) shielding can arrangement mounted thereon, the EMI shielding can arrangement including a support structure;

receiving a flex circuit;

locating a conductive PSA between the PCB and the flex circuit, wherein the PCB, the flex circuit, and the conductive PSA form a layer stack;

applying a load to the support structure, wherein applying the load to the support structure causes the load to be applied on a first surface of the layer stack; and applying heat to a second surface of the layer stack, wherein the pressure and the heat are applied by a plurality of conductive PSA support heads.

7. The method of claim 6 wherein the EMI shielding can arrangement includes a wall that is folded to create the support structure.

8. The method of claim 6 wherein the EMI shielding can arrangement includes a shielding can and a block structure, wherein the block structure forms at least part of the support structure.

9. The method of claim 8 wherein the shielding can is arranged to be at least partially supported by the block structure.

10. The method of claim 8 wherein the EMI shielding can arrangement includes a wall, the wall having a first surface and a second surface, the wall being arranged to be at least partially supported on the block structure such that the first surface is supported on the block structure while the second surface is in contact with the block structure.

11. The method of claim 6 wherein the first surface of the layer stack is associated with the PCB and the second surface of the layer stack is associated with the flex circuit.

12. The method of claim 6 wherein applying the heat to the second surface of the layer stack causes the conductive PSA to bond to the PCB and to the flex circuit.

* * * * *